United States Patent
Kitamura (12) 
(10) Patent No.: US 6,316,983 B1
(45) Date of Patent: Nov. 13, 2001

(54) PREDISTORTION CIRCUIT

(75) Inventor: Keiichi Kitamura, Miura (JP)

(73) Assignee: YRP Advanced Mobile Communication Systems Research Laboratories Co., Ltd., Kanagawa-ken (JP)

(*) Notice: Subject to any disclaimer, the term of this patent is extended or adjusted under 35 U.S.C. 154(b) by 0 days.

(21) Appl. No.: 09/726,428

(22) Filed: Dec. 1, 2000

(30) Foreign Application Priority Data

Jul. 26, 2000 (JP) .................................. 12-225247

(51) Int. Cl.[7] .................. H03F 1/32; H03L 5/00

(52) U.S. Cl. .................. 327/317; 327/306; 330/149

(58) Field of Search .................. 327/306, 307, 327/133, 317, 362; 330/149

(56) References Cited

U.S. PATENT DOCUMENTS 6,204,718 * 3/2001 Pidgeon, Jr. .................. 327/317

* cited by examiner

*Primary Examiner*—Dinh T. Le
(74) *Attorney, Agent, or Firm*—Louis Woo (57) ABSTRACT

An input signal is phase-inverted to supply the inverted signal to a gate of an FET. When the gate-source voltage Vgs decreases, the differential resistance Rds of the FET increases. Moreover, the differential resistance Rds also increases when the drain-source voltage Vds increases. That is, if the magnitude of the input signal from the signal source (2) increases, the gate-source voltage Vgs decreases and the drain-source voltage Vds increases, so that the differential resistance Rds varies largely. This compensates the non-linearity of the following saturation amplifier. Phase compensation is also effected with a capacitor (stray capacitor) or an inductor connected in parallel to the FET in corporation of the phase inverter. The phase inverter may be structured using the stray capacitances of the FET.

8 Claims, 10 Drawing Sheets

$$G = \frac{Zp}{Rs + Zp}$$

$$Zp = \frac{1}{\frac{1}{Rds} + j\omega Cp + \frac{1}{RL}}$$

$$G = \frac{\dfrac{Rds \cdot RL}{Rds + RL}}{Rs + \dfrac{Rds \cdot RL}{Rds + RL}}$$

FIG. 16

PREDISTORTION CIRCUIT

BACKGROUND OF THE INVENTION

1. Field of the Invention

This invention relates to a predistortion circuit for compensating the non-linearity of an amplifier.

2. Description of the Prior Art

Predistortion circuits for compensating the non-liner characteristic of a high frequency power amplifier are known. If a plurality of carrier signals having different frequencies are inputted to a high frequency power amplifier having a non-linear characteristic, such as the last stage of a radio apparatus or a video apparatus, intermodulation occurs. For example, if it is assumed that the frequency of the first carrier signal inputted to a power amplifier is f1, the frequency of the second carrier is f2, wherein f2>f1, spurious outputs such as third intermodulation distortion components of (2f2−f1) and (2f1−f2) and fifth intermodulation distortion of (3f2−2f1) and (3f1−2f2) are developed. As mentioned above, if there is intermodulation, various spurious outputs are developed. This may interfere the neighbor channels. Then, the minimum suppression amount (IM3) of the third intermodulation distortion component of the carrier signal and that of the fifth intermodulation distortion component of the carrier signal are specified. Thus, in the amplification characteristic, a suppression amount higher than the specified suppression amount is required. However, because the power of the fifth intermodulation distortion component is smaller than the third one, it is actually enough to suppress the power of the third intermodulation distortion component under the predetermined value.

Recently, in the mobile communication systems, a multi-value modulation such as 16QAM having much amplitude variation or a multi-carrier system are proposed to provide the high speed data transmission in addition to voice signals. Thus, the power amplifier for a base station is required to have a high linearity in addition to the high output and high efficiency.

On the other hand, a saturation type of amplifier having a non-linear characteristic is used for the power amplifier in consideration of the power efficiency. Then, the predistortion circuit having the non-linear characteristic that has an inverse relation with the non-linearity of the power amplifier having a non-linear characteristic is provided before the power amplifier. Thus, a high linearity is obtained by suppressing the third intermodulation distortion component due to the non-linier characteristic of the power amplifier.

SUMMARY OF THE INVENTION

The aim of the present invention is to provide a superior predistortion circuit.

According to the present invention, a first aspect of the present invention is a predistortion circuit for compensating the non-linear characteristic of the following amplifier comprising: a line between input and output terminal; an active element connected between said line and the earth; bias voltage supplying means for supplying a predetermined bias voltage to a control electrode of said active element; phase compensation means connected in parallel to said active element; and inverting means for inverting the phase of said input signal and supplying the inverted input signal to said control electrode of said active element.

Preferably, said phase compensation means comprises a capacitance.

Preferably, said phase compensation means comprises a stray capacitance between a first electrode of said active element connected to said line and a second electrode of said active element connected to the earth.

Preferably, said phase compensation means comprises an inductor.

Preferably, said inverting means further comprises gain controlling means for controlling a gain of said inverting means to control an amount of compensating the non-linear characteristic.

Preferably, said phase inverting circuit comprises a stray capacitance between a first electrode of said active element connected to said line and said control gate of said active element, a capacitor connected between said control gate and the earth, and an inductor connected in equivalently parallel to said capacitor.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Prior to describing embodiments, the background of the present invention will be further described.

Figure 14:
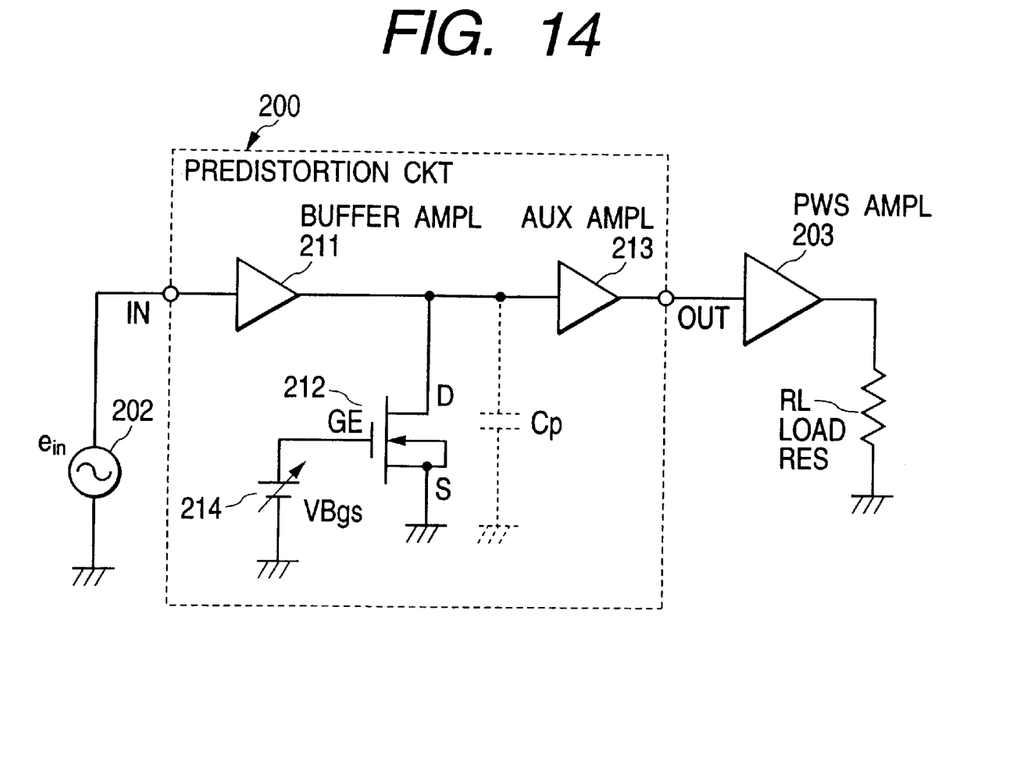
FIG. 14 is a schematic circuit diagram of a predistortion circuit of the background of this invention.

FIG. 14 shows a predistortion circuit proposed by the same Applicant of the present invention disclosed in Japanese patent application No. 11-248322.

An input terminal IN of the predistortion circuit 200 is supplied with an input signal $e_{in}$ from a signal source 202. An output terminal OUT of the predistortion circuit 200 is connected to a power amplifier 203 that is a saturation amplifier. The output of the power amplifier 203 is supplied to a load resistance RL. In addition, the predistortion circuit 200 is provided before the power amplifier 203 to make the input and output characteristic of the output signal of the power amplifier 203 substantially linear.

Figure 16:
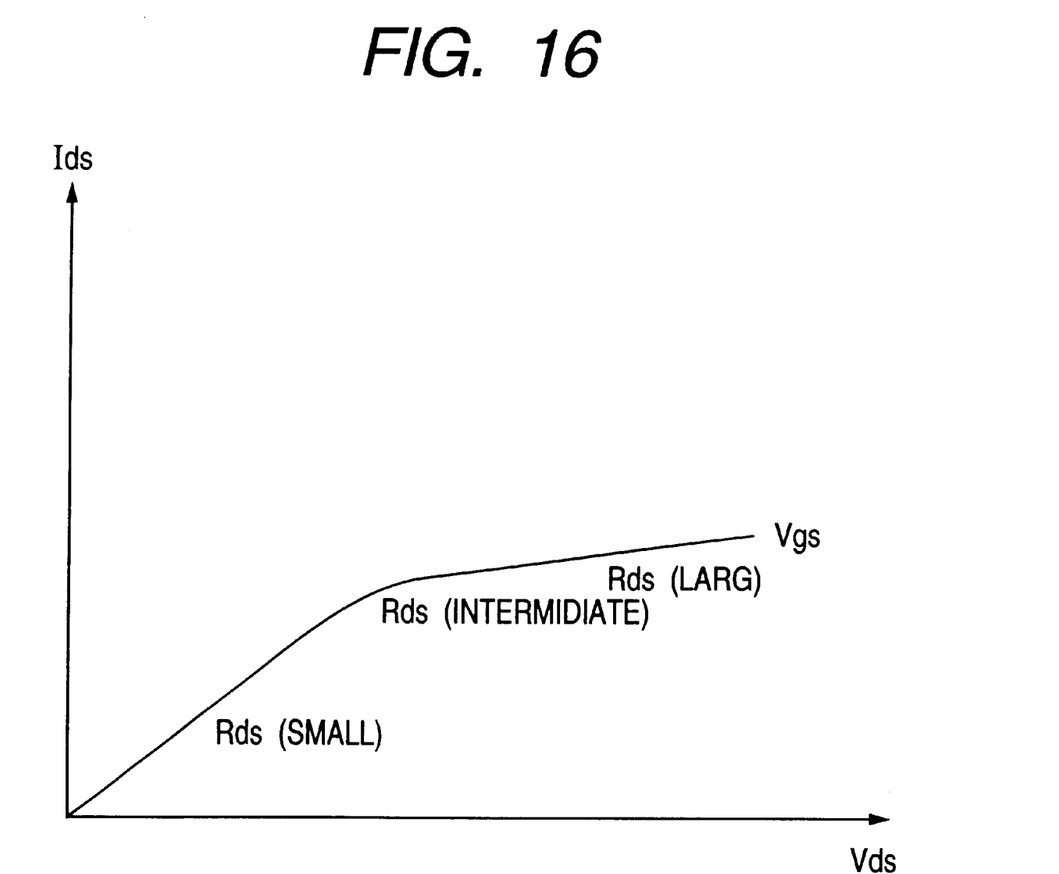
FIG. 16 is a graphical diagram showing the differential resistance characteristic of the predistortion circuit shown in FIG. 14.

The predistortion circuit 200 includes a buffer amplifier 211 having a gain of about 0 dB, and an auxiliary amplifier 213 arranged after the buffer amplifier 211. The input impedances and output impedances of the buffer amplifier 211 and the auxiliary amplifier 213 are matched to impedances of their input sides and output sides. Further, an N channel MOS FET (metallic oxide semiconductor electric-field effect transistor) 212 is connected between the line supplied with the output of the buffer amplifier 211 and the earth. That is, the drain electrode D of the N-MOSFET 212 is connected to the above-mentioned line and the source electrode S is connected to the earth. Further, a bias voltage VBgs is supplied to the gate electrode GE from a bias voltage source 214. Generally, when a drain-source voltage Vds (voltage between the drain and the source) of an FET is varied, the drain current Ids varies with a saturation-function-like non-linear characteristic as shown in FIG. 16 for example. Thus, the drain-source resistance Rds with respect to the drain-source voltage Vds varies with a non-liner characteristic like an exponential function. This non-liner characteristic varies with the bias voltage VBgs supplied to the gate electrode GE.

Figure 15:
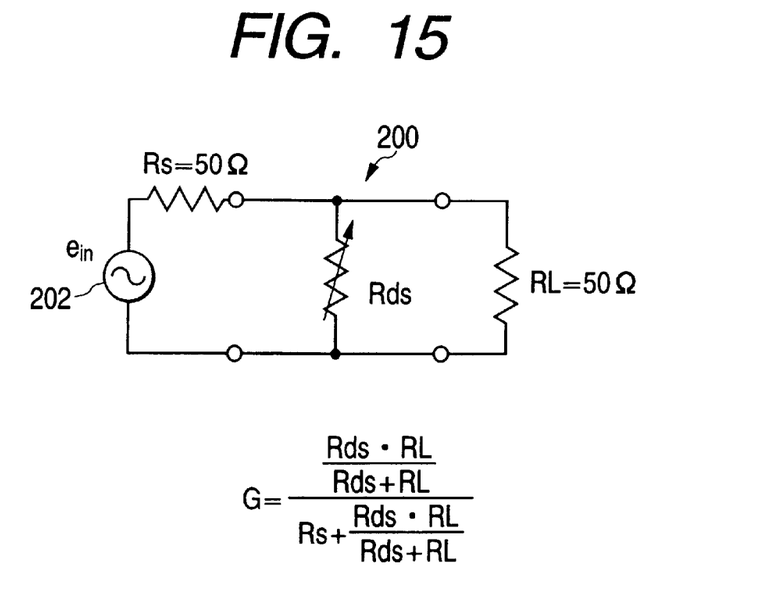
FIG. 15 is an equivalent circuit diagram of the predistortion circuit shown in FIG. 14.

FIG. 15 shows an equivalent circuit of the predistortion circuit 200 in FIG. 14. As shown in the equivalent circuit, the N-MOSFET 212 is represented as a differential resistance Rds that is connected between the input and output in parallel. Further, the internal impedance of the signal source 202 is represented with Rs. It is assumed that the internal impedance Rs is 50Ω and the load resistance RL is also 50Ω for example. Then, the input output transmission function G of the predistortion circuit 200 is given by:

$$G=\{Rds \cdot RL/(Rds+RL)\}/\{Rs+Rds \cdot RL/(Rds+RL)\} \quad (1)$$

wherein Rds represents the drain-source differential resistance, that is, the ac resistance.

The drain current Ids with respect to the variation of the drain-source voltage Vds shows a saturation characteristic rising with increase in the drain current Ids. Thus, the greater the bias voltage VBgs, the grater the drain current. Accordingly, the differential resistance Rds exponentially increases with increase in the drain-source voltage Vds and the differential resistance Rds decreases with increase in the bias voltage VBgs.

The differential resistance Rds varies as mentioned above, the loss characteristic of the predistortion circuit 200 becomes a non-linear characteristic wherein the loss decreases with increase in the amplitude of the input signal. In addition, the non-linear characteristic varies with the bias voltage VBgs applied to the ate electrode.

The loss of the predistortion circuit 200 becomes minimum is when the differential resistance Rds becomes maximum. For example, when the differential resistance Rds becomes infinite, the transmission function G represented by the EQ. (1) is $G_{Rds=\infty}=RL/(Rs+RL)$. Here, if it is assumed that Rs=RL, $G_{Rds=\infty}=½$. That is, the minimum loss of the redistortion circuit 200 is 6 dB. If the amplitude of the input signal is zero, the differential resistance Rds becomes minimum, so that the loss of the predistortion circuit 200 becomes maximum. For example, if the differential resistance Rds is 10Ω when the amplitude of the input signal is zero. Then, the transmission function G is about 0.142, so that the loss of the predistortion circuit 200 is about 17 dB. Thus, the gain of the auxiliary amplifier 213 shown in FIG. 14 for compensating the loss in the predistortion circuit 200 is set at 15 dB to 20 dB.

In operation of the predistortion circuit 200, as the amplitude of the input signal $e_{in}$ from the signal source 202 increases, the drain-source voltage Vds of the N-MOSFET 212 increases. As the result, the differential resistance Rds increases, so that the loss of the predistortion circuit 200 decreases.

That is, increase in the amplitude of the input signal $e_{in}$ of the signal source 202 decreases the loss in the predistortion circuit 200, so that a greater magnitude of the input signal is supplied to the power amplifier 203. Thus, the non-liner characteristic of the power amplifier 203 originally having the saturation characteristic is compensated by the non-linear characteristic of the predistortion circuit 200, so that the output level varies with linearly. That is, the non-linear characteristic of the power amplifier 203 and the non-linier characteristic of the predistortion circuit 200 have an inverse relation, so that the total characteristic of the predistortion circuit 200 and the power amplifier 203 becomes linear.

In the above-mentioned predistortion circuit 200, the non-linearity of the power amplifier in amplitude has been compensated. However, the non-linearity in phase is not compensated. Thus, the suppression amount of the third intermodulation distortion component to the carrier signal is limited to a certain degree.

The same Applicant of the present invention proposed such a predistortion circuit for compensating the non-linearity in phase in Japanese Patent application No. 2000-80163. That is, a phase compensation capacitor Cp (denoted with chain lines in FIG. 14) is further provided between the line between the buffer amplifier 211 and the auxiliary amplifier 213 and the earth. The phase compensation capacitor Cp connected in parallel to the FET 212 lags the output signal of the predistortion circuit 200. This compensates the phase lag in the power amplifier 203 originally showing a phase advancing characteristic.

In the predistortion circuit, an HEMT (High Electron Mobility Transistor) can be used in place of the FET 212. However, the characteristic of the drain-source voltage Vds to drain current Ids is inconstant at the region where the drain-source voltage Vds is large. Then, if the device such as the HEMT is used for the predistortion circuit, the differential resistance Rds does not increase up to infinite at the region where the drain-source voltage Vds is large. Thus, the distortion compensations amount of the predistortion circuit may be insufficient at the saturation region of the saturation amplifier. Thus, embodiments of the present invention provide predistortion circuits having sufficient compensation amount at the saturation region though the active element (HEMT) showing the inconstant drain current at the large drain-source voltage region is used.

Embodiments of this invention will be described.

<First Embodiment>

Figure 1:
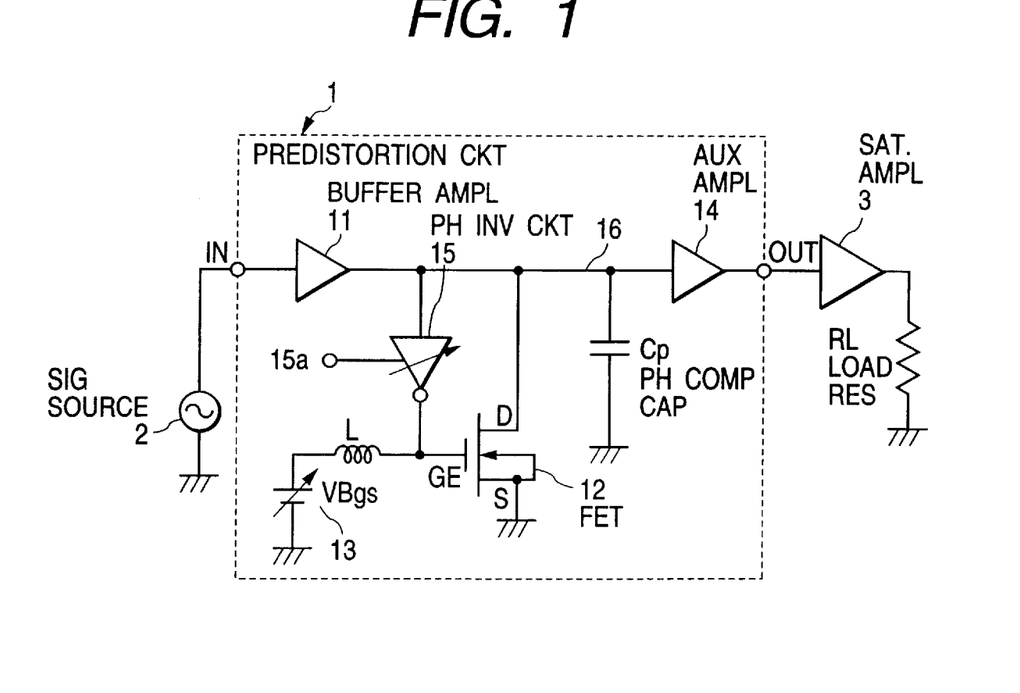
FIG. 1 is a schematic circuit diagram of a predistortion circuit according to a first embodiment.

FIG. 1 is a schematic circuit diagram of a predistortion circuit 1 according to the first embodiment.

An input signal is supplied to an input terminal IN of the predistortion circuit 1 from the signal source 2. After the predistortion circuit 1, a saturation amplifier 3 is connected to the output terminal OUT of the predistortion circuit 1. The output of the saturation amplifier 3 is supplied to a load resistance RL. If the saturation amplifier 3 is the final stage of a transmitter, the load resistance RL is an antenna system. The antenna system generally includes a matching circuit and an antenna. Providing the predistortion circuit 1 before the saturation amplifier 3 makes the input and output characteristic of the output signal of the saturation amplifier 3 linear. This provides a sufficient suppressing amount (IM3) of the third inter modulation component in the carrier signal.

This predistortion circuit 1 includes a buffer amplifier 11 having a gain of about 0 dB, an auxiliary amplifier 14 provided after the buffer amplifier 11, and a phase inverting circuit 15 for inverting the output of the buffer amplifier 11. The input impedances and output impedances of the buffer amplifier 11 and the auxiliary amplifier 14 are matched to impedances of their input sides and output sides. Further, an N channel MOS type of electric-field effect transistor (N-MOSFET) 12 is connected between the line supplied with the output of the buffer amplifier 11 and the earth as an active element. That is, the drain electrode D of the N-MOSFET 12 is connected to the above-mentioned line and the source electrode S is connected to the earth. Further, a bias voltage VBgs is supplied to the gate electrode GE from a bias voltage source 13 through a choke coil L. Moreover, the gate electrode GE is supplied with the phase-inverted signal from the phase inverting circuit 15. This structure futures the present invention. The choke coil L is provided to avoid attenuation of the output of the phase inverting circuit 15 by the bias voltage source 13. That is, the choke coil L provides a high impedance at the output of the phase inverting circuit 15. Moreover, this choke coil L can be replaced with a resistor having a high resistance.

Figure 3:
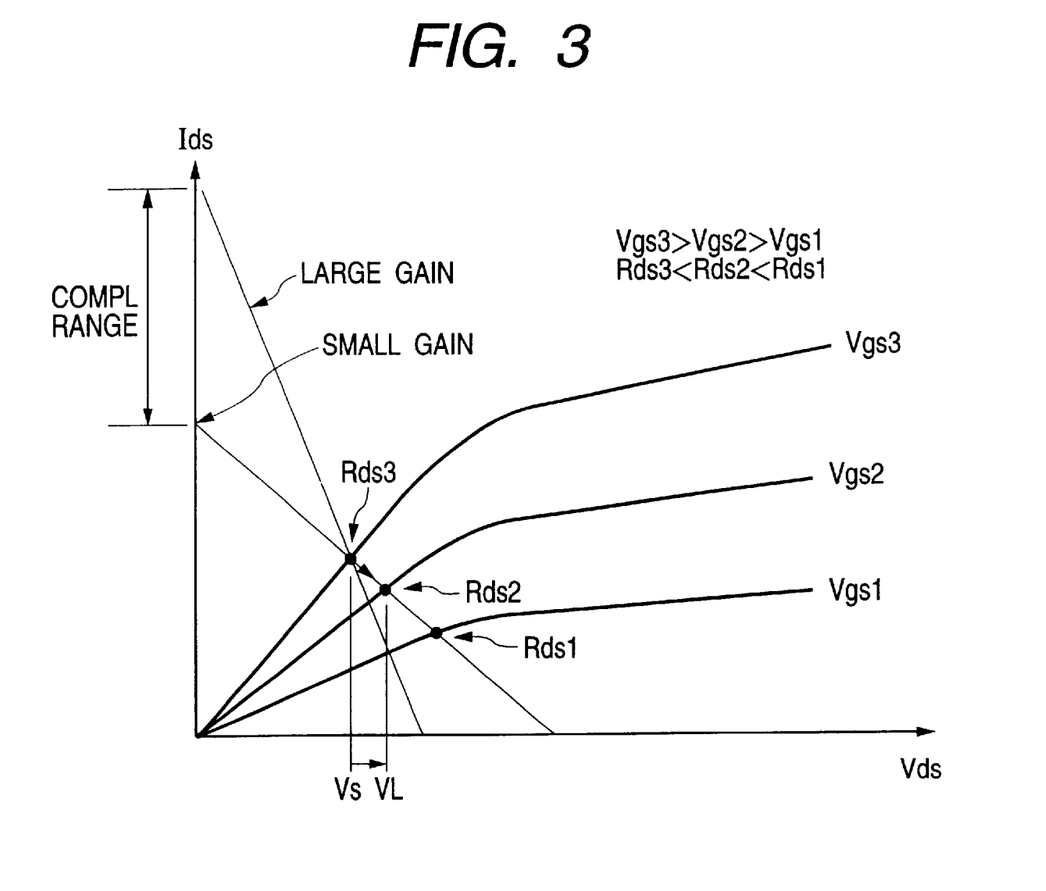
FIG. 3 is a graphical drawing showing a drain current characteristic with respect to the drain-source voltage according to the first embodiment.

FIG. 3 shows a drain current characteristic with respect to the drain-source voltage Vds (voltage between the drain and the source).

Generally, a drain-source voltage Vds of an FET is varied, the drain current Ids varies with a non-linear characteristic as shown in FIG. 3 for example. Thus, the drain-source differential resistance Rds with respect to the drain-source voltage Vds varies with a non-liner characteristic. This non-liner characteristic varies with the gate-source voltage Vgs (voltage between the gate and source) which is the sum of the bias voltage VBgs and the output voltage of the phase inverting circuit 15 supplied to the gate electrode GE.

The predistortion circuit 1 shown in FIG. 1 compensates the non-linear characteristic in amplitude in the saturation amplifier 3 using the non-linear characteristic of the differential resistance Rds. In addition, the gain of the phase inverting circuit 15 can be varied in accordance with a control signal supplied to a gain control terminal 15*a* of the phase inverting circuit 15 including a gain control circuit. Then, the variation of the gain of the phase inverting circuit 15 adjusts a compensation amount of the amplitudes and the phase as shown in FIG. 3.

In addition, a phase compensation capacitor Cp is connected in parallel with the FET 12. That is, the phase compensation capacitor Cp connected in parallel to the differential resistance Rds between the drain and source having the non-linear characteristics compensates the non-liner characteristic of phase of the saturation amplifier 3.

Figure 2:
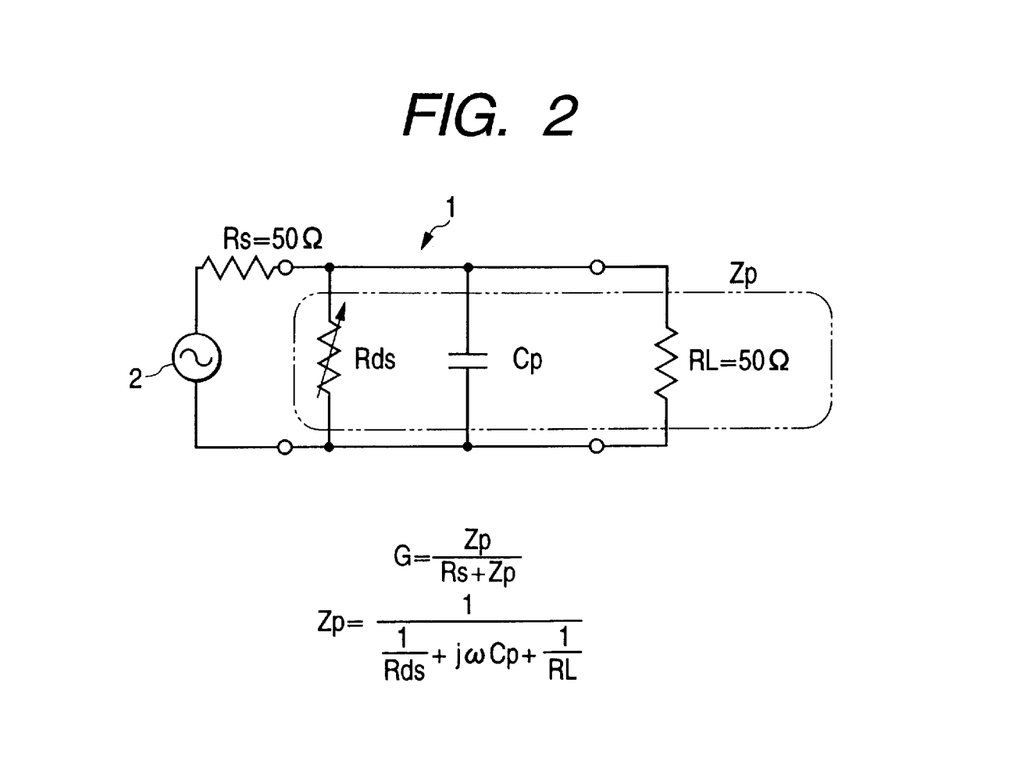
FIG. 2 is an equivalent circuit diagram of the predistortion circuit shown in FIG. 1.

FIG. 2 shows an equivalent circuit of the predistortion circuit 1. As shown in the equivalent circuit, the N-MOSFET 12 is represented as a differential resistance Rds connected between the input and output in parallel, wherein the input and output impedances of the buffer amplifier 11 are omitted because they do not influence the transmission function due to matching with the input and output sides.

The internal impedance of the signal source 2 is represented with Rs. It is assumed that the internal impedance Rs is 50Ω. The input impedance of the auxiliary amplifier 14 is matched to the load resistance RL which is 50Ω for example. Here, it is assumed that the parallel impedance derived from parallel connection among the differential resistance Rds, the phase compensation capacitor Cp, and the input impedance RL is Zp. Then, the input output transmission function G of the predistortion circuit 1 is given by:

$$G=Zp/(Rs+Zp) \qquad (2)$$

wherein the impedance Zp is given by:

$$Zp=1/\{(1/Rds)+j\omega Cp+(1/RL)\} \qquad (3)$$

wherein Rds represents the differential resistance between the drain and source of the FET 12, that is, an ac resistance.

The differential resistance Rds between the drain and source of the FET 12 non-linearly varies in accordance with the voltage level Vds of the signal outputted by the buffer amplifier 11 as mentioned above. In addition, the differential resistance Rds varies by application of the phase-inverted input signal from the phase inverting circuit 15 to the gate electrode GE. Here, because the input signal applied to the gate electrode GE of the FET 12 is phase-inverted by the phase inverting circuit 15, the inverted signal from the phase inverting circuit 15 decreases as the signal outputted by the buffer amplifier 11 increases. That is, when the drain-source voltage (voltage between the drain and source) Vds increases, the gate-source voltage Vgs decreases. Moreover, the differential resistance Rds between the drain and source of the FET 12 increases with increase in the drain-source voltage Vds and as well as, increases with decrease in the gate-source voltage (voltage between the gate and source) Vgs. Thus, when the magnitude of the input signal of the signal source 2 increases, variation of the differential resistance Rds increases because of the increase in the drain-source voltage Vds and decrease in the gate-source voltage Vgs.

For example, if the gain of the phase inverting circuit 15 is set at a small value and the drain-source voltage Vds of the FET 12 is Vs as shown in FIG. 3. Then, if the drain-source voltage Vds of the FET 12 varies from Vs to VL as the input signal level increases, as shown in FIG. 3, the gate-source voltage Vgs shifts from Vgs3 to Vgs2 along the load line. Thus, the differential resistance Rds3 becomes the differential resistance Rds2, so that the differential resistance increases. As mentioned above, the differential resistance Rds largely varies in accordance with the level of the input signal, which enables to largely compensate the gain compression at the saturation region of the saturation amplifier and the phase advancement as mentioned later.

Moreover, as shown in FIG. 3, the amount of compensation can be adjusted in accordance with the gain of the phase inverting circuit 15. The above-mentioned explanation has been made in the case that the gain of the phase inverting circuit 15 is small. On the other hand, if the gain of the phase inverting circuit 15 is high, the gate-source voltage Vgs shifts along the load line, so that the variation of the differential resistance Rds more largely increases. That is, the amount of distortion compensation can be made large with increase in the gain of the phase inverting circuit 15.

Moreover, the condition that the loss in the predistortion circuit 1 becomes minimum is when the input signal level from the signal source 2 is high and thus, the differential resistance Rds becomes maximum. On the other hand, when the input signal level from the signal source 2 becomes about zero, the differential resistance Rds becomes minimum and the loss of the predistortion circuit 1 becomes maximum. The auxiliary amplifier 14 compensates this loss, so that the gain of the auxiliary amplifier 14 is 15 dB to 20 dB for example.

As mentioned, when the amplitude of the input signal from the signal source 2 becomes large, the loss of the predistortion circuit 1 decreases, so that the larger level of the input signal is inputted to the saturation amplifier 3. Thus, the non-linear characteristic of the saturation amplifier 3 is made linear by compensation by the non-liner characteristic of the predistortion circuit 1. That is, the non-linear characteristic of the saturation amplifier 3 and the non-linear characteristic of the predistoriton circuit 1 are in the inverse relation. Thus, the total characteristic of the saturation amplifier 3 following the predistortion circuit 1 is made linear.

Next, phase compensation will be described with reference to an equivalent circuit diagram shown in FIG. 4A and vector diagrams shown in FIGS. 4B and 4C.

Figure 4A:
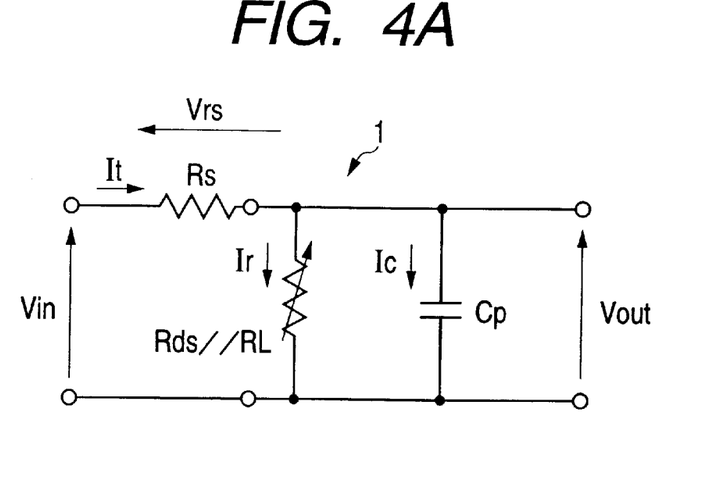
FIG. 4A is another equivalent circuit diagram of the predistortion circuit according the first embodiment.
Figure 4B:
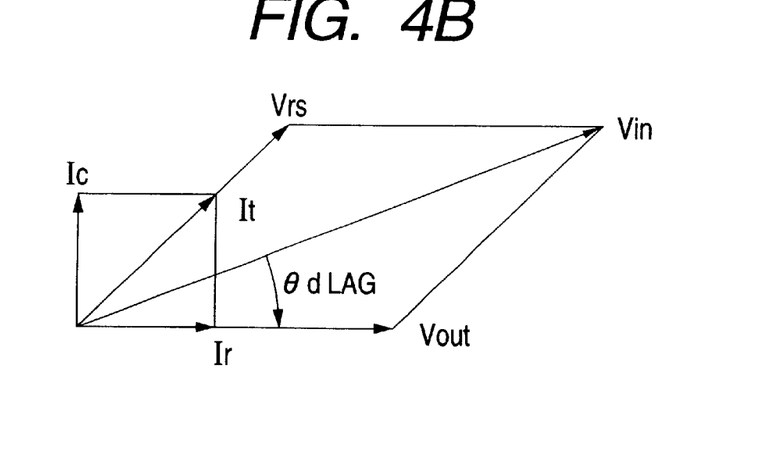
FIGS. 4B and 4C are vector diagrams illustrating the phase compensation operation according to the first embodiment.
Figure 4C:
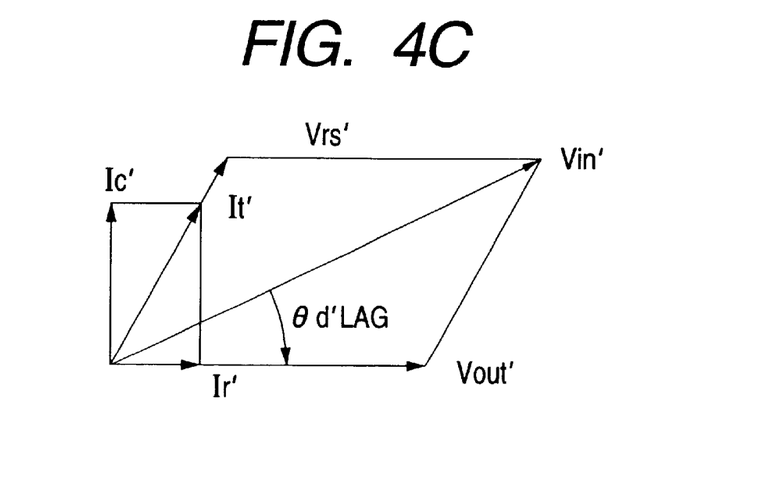

In the equivalent circuit of the predistortion circuit 1 shown in FIG. 4A, the phase relation of the output signal voltage Vout with respect to the input signal voltage Vin from the signal source 2 is shown in FIG. 4B and 4C. In the drawings, the current It is supplied from the signal source 2, the current Ir is a shunt current flowing through the differential resistance Rds and the input impedance RL of the auxiliary amplifier 14 connected in parallel, and the current Ic is a shunt current flowing through the phase compensation capacitor Cp. Moreover, the voltage Vrs is a voltage drop across the internal resistor Rs of the signal source 2.

As shown in FIG. 4B, the input signal voltage Vin is divided into the voltage drop Vrs and the output signal voltage Vout. On the other hand, since the current Ic is a current flowing through a capacitor, it advances from the current Ir flowing through a resistor by 90°. The current It is derived by combining the vectors of the current Ic and the current Ir. The voltage drop Vrs has the same phase as the current It due to the voltage drop at the internal resistance Rs. Accordingly, the output signal voltage Vout lags from the input signal voltage Vin by phase θ d as shown in FIG. 4B.

Here, if the level of the input signal voltage Vin increases (the drain-source voltage Vds of the FET 12 increases and as well as, the gate-source voltage Vgs decreases), the differential resistor Rds increases up to the differential resistance Rds'. As the result, the current Ir decreases up to the current Ir' as shown in FIG. 4C. This increases the current Ic'. Thus, the phase of the current It' more advances as shown in FIG. 4C. Accordingly, the phase of the voltage drop Vrs' also advances. Thus, the output signal voltage Vout' more lags from the input signal voltage Vin' by θ d'.

As mentioned above, the differential resistance Rds increases with increase in the level of the input signal voltage Vin from the signal source 2, so that the phase of the output signal voltage Vout more lags. Moreover, decrease in the level of the input voltage Vin from the signal source 2 decreases the differential resistance Rds, so that the phase lag amount of the output signal voltage Vout becomes small. That is, the lag phase amount of the predistortion circuits 1 varies with the level of the input signal voltage Vin from the signal source 2. This compensates the phase of the saturation amplifier, which originally shows a phase advancing characteristic.

Further, when the bias voltage VBgs of the bias voltage source 13 applied to the gate electrode of the FET 12 is varied, the differential resistance Rds varies in accordance with the variation of the bias voltage VBgs. Then, the dividing ratio of the current Ir and the current Ic varies. That is, variation of the bias voltage VBgs can adjust the phase lag amount of the output signal voltage Vout from that of the input signal voltage Vin.

As mentioned above, according to the predistortion circuit 1 of the first embodiment, the differential resistance Rds largely varies in accordance with the level of the input signal. This enables to largely compensate the gain compression and the phase advancement in the saturation region of the saturation amplifier 3.

Figure 5:
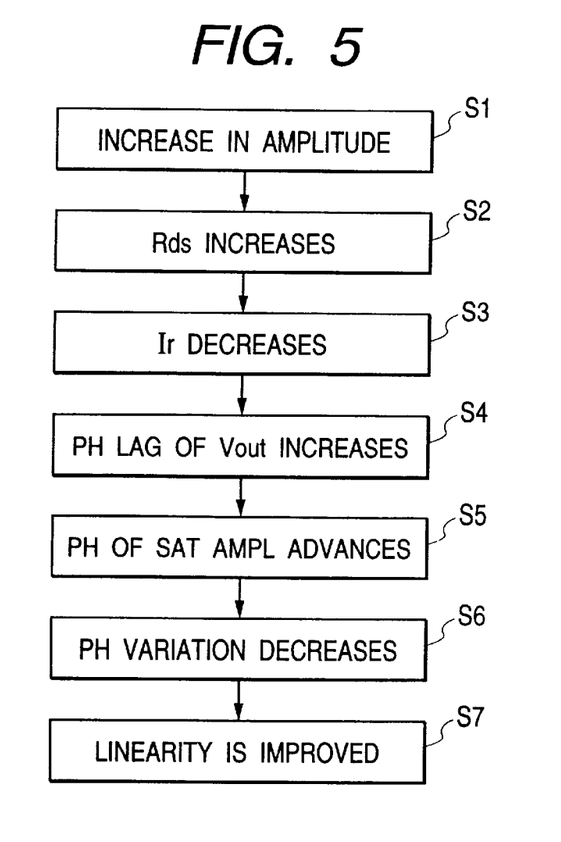
FIG. 5 depicts a flow chart showing the operation of the predistortion circuit according to the first embodiments.

According to the above-mentioned operations, the predistortion circuit 1 operates as shown in the flow chart in FIG. 5 to compensate the non-liner characteristics of the amplitude and the phase of the saturation amplifier 3.

When the amplitude of the input signal voltage Vin of the signal source 2 increases (step s1), the drain-source voltage Vds of the FET 12 increases and as well as, the gate-source voltage Vgs decreases, so that the differential resistance Rds increases and the differential resistance Rds largely increases because the gate-source voltage Vgs decreases (step S2). As the result, the current Ir flowing through the differential resistance Rds degreases (step S3). This increases the amplitude of the output voltage Vout and the phase lag increases (step S4). This output voltage Vout is supplied to the saturation amplifier 3.

In this case, the phase of the amplified output of the saturation amplifier 3 advances in accordance with the level of the input signal and as well as, the amplitude decreases (step s5). Thus, the saturation of amplified output from the saturation amplifier 3 is suppressed and the phase variation is decreased (step s6). Thus, the predistortion circuit 1 compensates the non-linearity in amplitude and the phase of the saturation amplifier 3, so that the linearity is improved (step s7).

Next, the phase inverting circuit 15 in the predistortion circuit 15 will be described with reference to FIG. 6.

Figure 6:
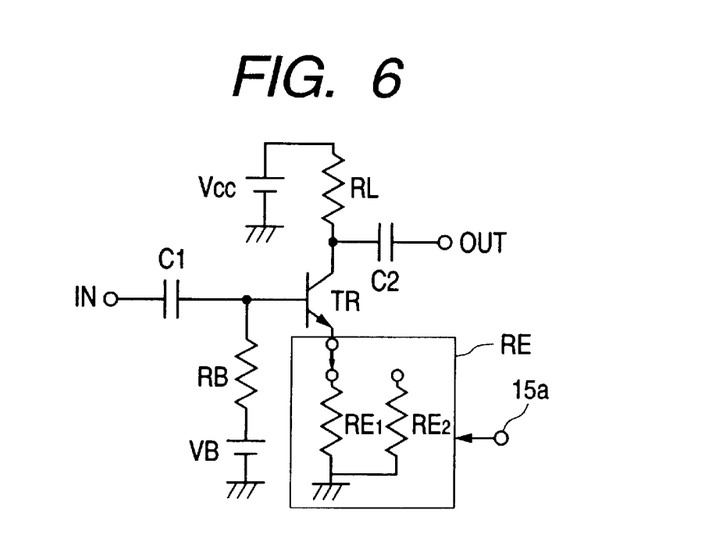
FIG. 6 is a circuit diagram of the phase inverting circuit shown in FIG. 1.

The phase inverting circuit 15 shown in FIG. 6 includes a transistor TR as an active element and has the inverting amplifying circuit structure adopting a common emitter circuit. The base of the transistor TR is supplied with the output of the buffer amplifier 11 through a capacitor C1 for dc current cutting. Moreover, the base is supplied with a base bias voltage through a resistor RB from a bias voltage source VB. The collector of the transistor TR is connected to an output resistor RL and a volage source Vcc is applied to the collector through the output resistor RL. The emitter of the transistor TR is connected to the earth through an emitter resistor circuit RE. The emitter resistor circuit RE acts as a resistor for current feeding back. Then, the gain GA of the phase inverting circuit 15 is represented by GA≈RL/RE. That is, variation of the emitter resistance RE provides variable gain phase inverting circuit. The variation of the emitter resistance RE is provided with that a plurality of different emitter resistors RE1 an RE2 are arranged in parallel and a switch selects one of them in accordance with a control signal from the terminal 15a. Moreover, it is also possible that a resistive element of which resistance varies is used as the emitter resistor circuit RE and the resistance value is controlled in accordance with the control signal.

<Second Embodiment>

Figure 7:
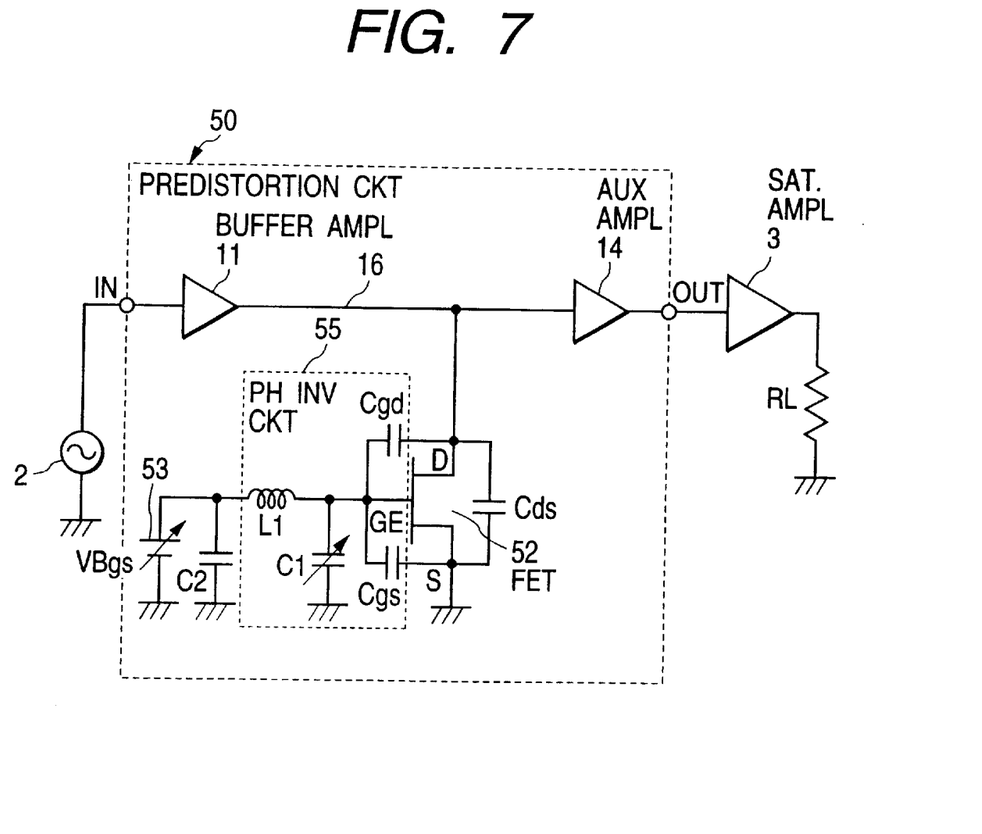
FIG. 7 is a schematic circuit diagram of a predistortion circuit according to a second embodiment.

The predistortion circuit according to a second embodiment has substantially the same basic operation and structure as those of the first embodiment. The difference is that the phase inverting amplifier 15 is replaced with a phase inverting circuit 55 employing a passive element circuit structure. Thus, descriptions about the corresponding elements and the corresponding operation are omitted and only different structure and operation will be described. FIG. 7 is a schematic circuit diagram of the predistortion circuit according to the second embodiment.

The input terminal IN of the predistortion circuit 50 is supplied with the input signal from the signal source 2. The output terminal OUT of the predistortion circuit 50 is connected to the saturation amplifier 3. The output of the saturation amplifier 3 is supplied to a load resistor RL. Providing the predistortion circuit 50 before the saturations amplifier 3 makes the input/output characteristic of the output signal of the saturations amplifier 3 substantially linear, wherein the input/output characteristic originally shows a saturation characteristic with respect to the input signal. Thus, the suppression amount (IM3) of the third intermodulation distortion component to the carrier signal becomes sufficient.

The predistortion circuit 50 includes the buffer amplifier 11 having a gain of about 0 dB, and an auxiliary amplifier 14 arranged after the buffer amplifier 11. The output of the buffer amplifier 11 is supplied to the auxiliary amplifier 14. An FET 52 is connected between the earth and the line supplying the output of the buffer amplifier 11 to the auxiliary amplifier 14. The FET 52 comprises an HEMT (High Electron Mobility Transistor). The drain electrode D (an output electrode) is connected to the line 16 between the output of the buffer amplifier 11 and the input of the auxiliary amplifier and the source electrode S (a common electrode) is connected to the earth.

Moreover, the gate electrode GE as the control electrode is supplied with the bias voltage VBgs from the bias voltage source 53 through the phase inverting circuit 55 including an inductor L1. The phase inverting circuit 55 includes a parallel circuit having the inductor L1 and a capacitor C1. In addition, the phase inverting circuit 55 is connected to the gate-drain (between gate and drain) stray capacitance (distributed capacitance) Cgd in series.

Moreover, a bypass capacitor C2 is connected in parallel to the bias voltage source VBgs to decrease the impedance of the bias voltage source VBgs at a high frequency. Moreover, there are a drain-source (between drain and source) stray capacitance Cds and the gate-source capacitance Cgs in the FET 52. The drain-source stray capacity Cds is used as the phase compensation capacitor. If only the capacitance of the drain-source stray capacitance Cds is insufficient, another capacitor can be connected between the drain and source of the FET 52 in parallel. Further, the gate-source stray capacitance Cgs exists such that it is connected in parallel to the capacitor C1 of the phase inverting circuit 55. Thus, the gate-source stray capacitance Cgs forms a part of the phase inverting circuit 55. The capacitor C1 is a variable to control the gain of the phase inverting circuit 55.

Figure 8:
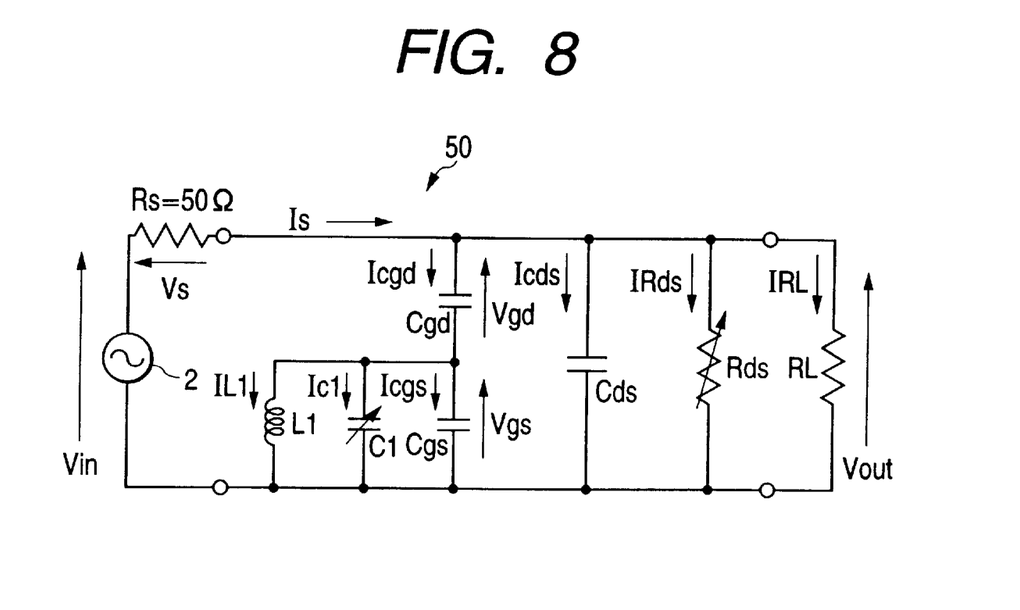
FIG. 8 is an equivalent circuit diagram of the predistortion circuit shown in FIG. 7.
Figure 9:
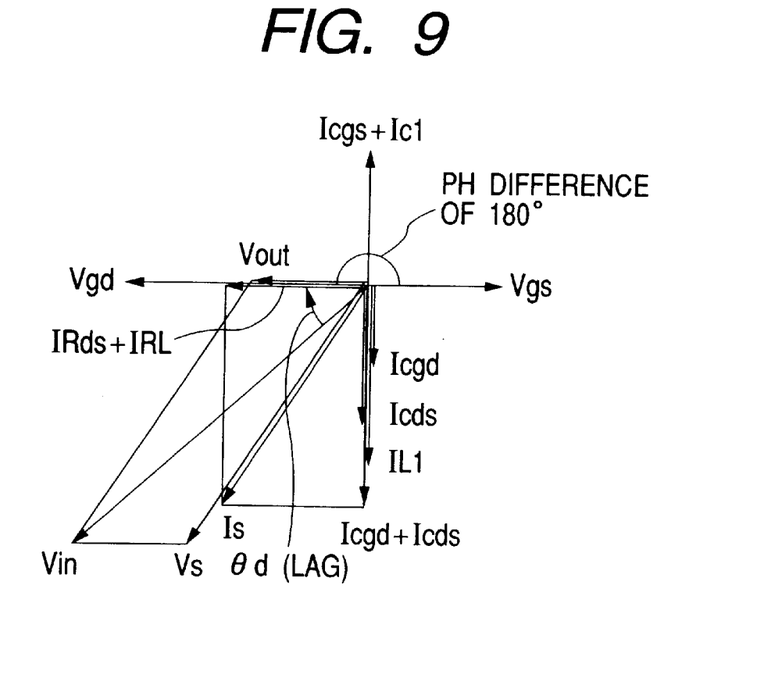
FIG. 9 is a vector diagram illustrating the operation of the predistortion circuit shown in FIG. 7.

FIG. 8 is an equivalent circuit diagram of the predistortion circuit 50 according to the second embodiment. FIG. 9 is a vector diagram according to the second embodiment illustrating the phase relation of the output signal voltage Vout with respect to the input signal voltage Vin and the phase relation of the phase inverting circuit 55. In FIG. 9, "Is" represents the current supplied from the signal source 2. "Icgd" represents a shunt current flowing through the gate-drain stray capacitance Cgd and the phase inverting circuit 55. "Icds" represents a shunt current flowing through the drain-source stray capacitance Cds that acts as the phase compensation capacitor. "IRds" represents a shunt current flowing through the differential resistance Rds in the FET 52. "IRL" represents a shunt current flowing through the input impedance RL of the auxiliary amplifier 14. "VS" represents the voltage drop across the internal resistance of the signal source 2. "Vgs" represents a divided voltage at the phase inverting circuit 55.

As shown in FIG. 9, the input signal voltage Vin is divided into the voltage drop Vs due to the internal resistance Rs and the output signal voltage Vout. The current Is is separated into the shunt current Icgd, the shunt current Icds, the shunt current Irds, and the shunt current IRL. Since the shunt current Icgd and the shunt current Icds flow through capacitances, they advance from the shunt current Irds and the shunt current IRL by 90°. The current Is is derived by combining the current (Icgd+Icds) and the current (Irds+IRL). Here, the voltage drop Vs has the same phase as that of the current Is. Thus, as shown in FIG. 9, the output signal voltage Vout lags from the input signal voltage Vin by a phase θ d.

Moreover, the shunt current Icgd has the same phase as the current IL1 flowing through the inductor L1. On the other hand, the shunt current Icgd is antiphase with the shunt current Ic1 and the current Icgs. Thus, the voltage Vgd across the gate-drain stray capacitance Cgd is antiphase with the voltage Vgs across the phase inverting circuit 55 as shown in FIG. 9. Moreover, the voltage Vgd is in phase with the output voltage Vout and Vout=Vgd+Vgs. That is, there is a phase difference of 180° between the output signal voltage Vout and the voltage Vgs across the phase inverting circuit 55, so that the phase inverting circuit 55 acts as a phase inverting circuit. Here, it is necessary to satisfy the conditions of IL1>Icgs+Ic1 and Vgd>Vgs to make the phase difference between the voltage Vgs and the output voltage Vout 180°.

Accordingly, when the drain-source voltage Vds of the FET 52 (=Vout) increases, the gate-source voltage Vgs decreases in accordance with the increase, so that variation in the differential resistance Rds with respect to the input signal voltage Vin can be increased. Moreover, when the capacitance of the capacitor C1 is varied, the magnitude of the current Ic1 varies and thus, the dividing ratio between the voltage Vgd and the voltage Vgs varies, so that the gain of the phase inverting circuit 55 can be varied.

When the level of the input signal voltage Vin (the drain-source voltage Vds of the FET 52 increases and as well as, the gate-source voltage Vgs decreases), the differential resistance Rds increases as mentioned above, so that the shunt current IRds decreases. This increases the shunt current Icgd and Icds, so that the phase of the current Is more advances. Thus, the phase of the voltage drop Vs also advances. This results in that the phase of the output signal voltage Vout lags from the phase of the input signal voltage Vin by θ d. On the other hand, as the level of the input signal voltage Vin from the signal source 2 decreases, the differential resistance Rds decreases, so that the lag amount of the phase of the output signal voltage Vout decreases.

As mentioned above, the lag amount in the predistortion circuit 50 varies in accordance with the level of the input signal voltage Vin from the signal source 2. Thus, the predistortion circuit 50 arranged before the saturation amplifier 3 can compensates the phase of the saturation amplifier 3 that originally shows phase advancement characteristic. That is, the predistortion circuit 50 can compensate the gain compression and phase advancement at the saturation region of the saturation amplifier 3.

Figure 10:
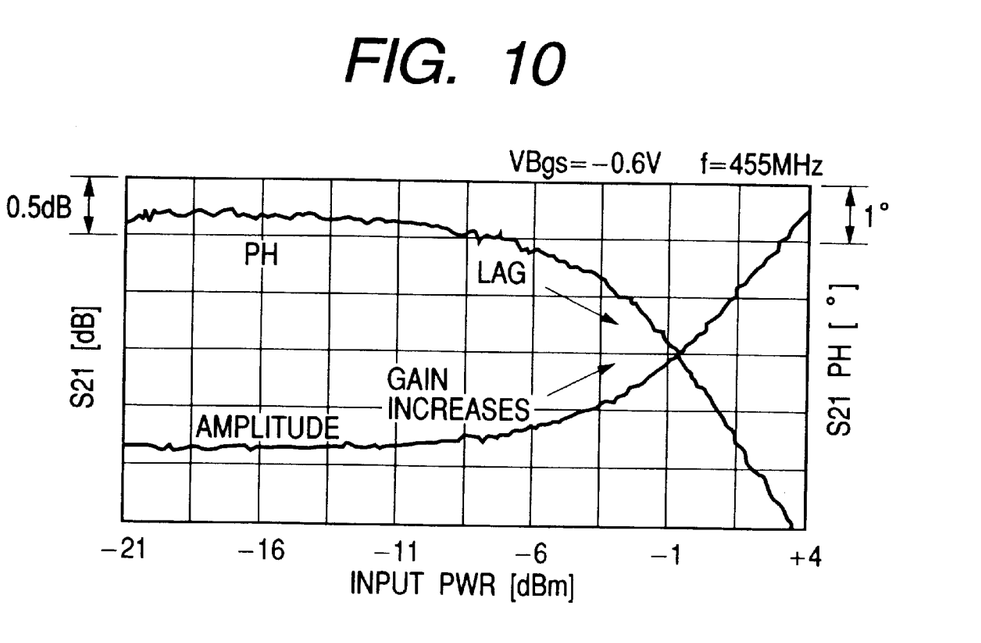
FIG. 10 is a graphical diagram illustrating the operation of the predistortion circuit shown in FIG. 7.

FIG. 10 is a graphical drawing showing the non-linearity of the predistortion circuit 50 according to the second embodiment.

FIG. 10 shows the amplitude characteristic and the phase characteristic of S21 parameter of the predistortion circuit 50 with respect to the input power when the bias voltage VBgs is about −0.6 V and the frequency f of the signal source 2 is 455 MHz. The S21 parameter represents a forward direction transmission coefficient out of scattering parameters. In FIG. 10, if the input power exceeds about −9 dBm, the gain of the predistortion circuit 50 increases and as well as, the phase becomes lagged. For example, when the input power increases to about −1 dBm, the amplitude increases by about 0.8 dB and the phase lags about 2.5°. When the input power increases to about +1.5 dBm, the amplitude increases by about 1.3 dB and the phase lags about 4°. Thus, the compensation of the amplitude and the advanced phase in the saturation amplifier 3 can be performed.

Figure 11:
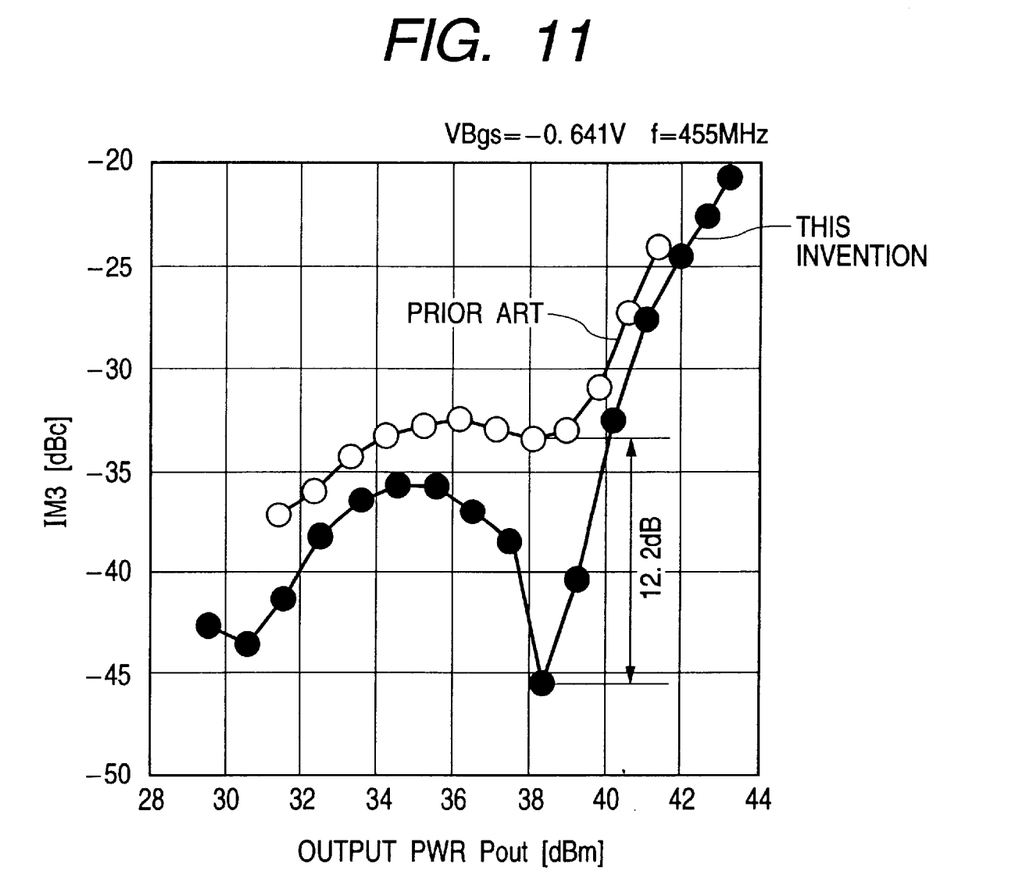
FIG. 11 is a graphical diagram illustrating experimental results of the predistortion circuit shown in FIG. 7 and a prior art.

FIG. 11 shows suppressing amount characteristic of the third intermodulation distortion component to the carrier signal in the saturation amplifier 3 between the case that the predistortion circuit 50 is provided before the saturation amplifier 3 and the case of no predistortion circuit.

In the case of no predistortion circuit, the third intermodulation distortion component can be suppressed under about −33 dBc when the output power Pout varies up to about 39 dBm. However, if the output power Pout exceeds about 40 dBm, the suppression amount decreases and thus, the third intermodulation component (IM3) rapidly increases.

In the case that the predistortion circuit 50 is provided before the saturation amplifier 3, the bias voltage VBgs is set to about −0.641 V and the frequency f of the signal source 2 is set to about 455 MHz. In this condition, the output power Pout up to about 37 dBc, the third intermodulation IM3 is suppressed under about −36 dBc and the output power Pout under about −46 dBc around 38 dBm. Thereafter, though with increase in the output power Pout, the third intermodulation IM3 increases, the suppression characteristic of the third intermodulation distortion component is more improved than that of the prior art (inexistence of the predistortion circuit 50). The maximum improvement is provided when the output power Pout is about 38 dBm. The suppression amount of the third intermodulation distortion component in this condition is improved by 12.2 dB.

<Third Embodiment>

Figure 12:
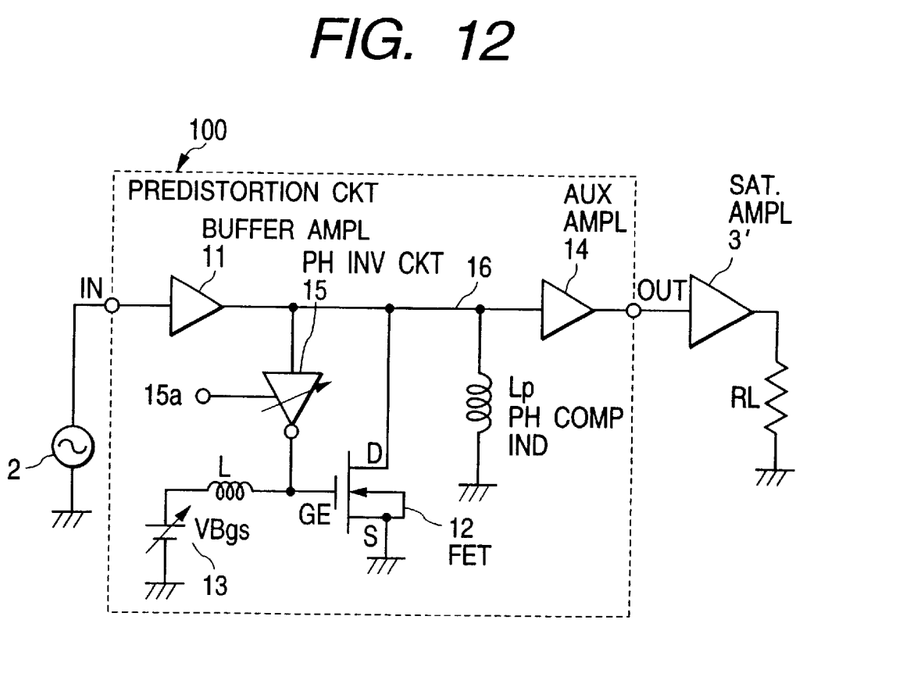
FIG. 12 is a schematic circuit diagram of a predistortion circuit according to a third embodiment.

FIG. 12 is a predistortion circuit of a third embodiment. The predistortion circuit 100 of the third embodiment has substantially the same structure as that of the first embodiment. The difference is that the predistortion circuit 100 is provided for a saturation amplifier having a lag characteristic instead the phase leading characteristic, that is, the predistortion circuit 100 compensates the amplifying characteristic and the phase lag characteristic of the following saturation amplifier 3' which originally shows non-linear amplitude characteristic and phase lagging characteristic.

More specifically, the predistortion circuit 100 uses a phase compensation inductor Lp instead the phase compensation capacitor Cp in the first embodiment. In this circuit, the current ILp flowing through the phase compensation indicator Lp lags the current Ir flowing through the differential resistance Rds by 90°. Thus, the phase of the output voltage Vout advances the input signal voltage Vin from the signal source 2 (this corresponds to the phase of the current Ic shifted by 180° in FIG. 4). This compensates the lagged phase in the saturation amplifier 3' in addition to the amplifying compensation. The operation of the amplification compensation is the same as the first embodiment, so that the detailed explanation is omitted.

<Fourth Embodiment>

Figure 13:
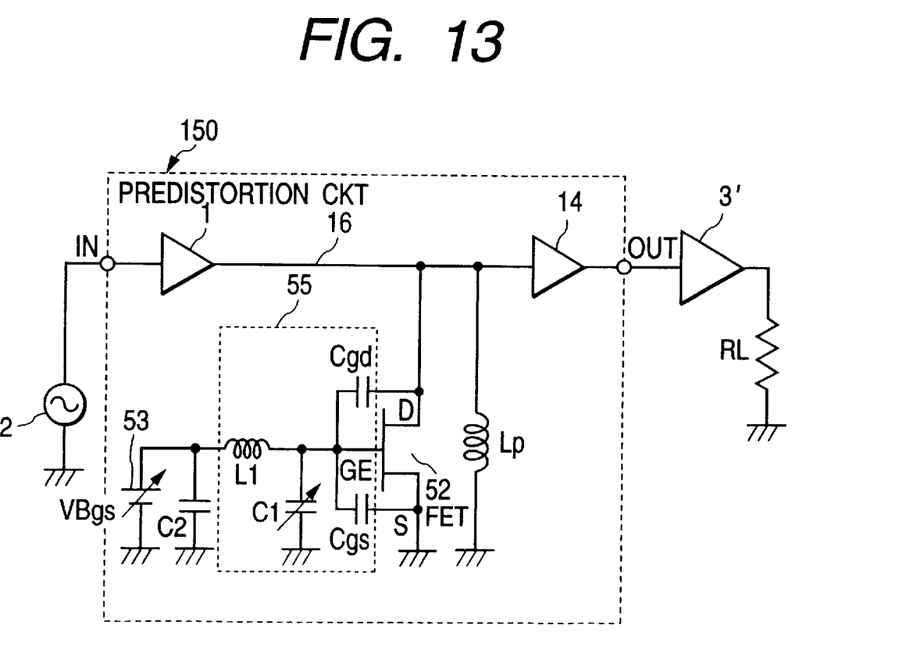
FIG. 13 is a schematic circuit diagram of a predistortion circuit according to a fourth embodiment.

FIG. 13 shows a predistortion circuit of a fourth embodiment. The predistortion circuit of the fourth embodiment has substantially the same structure as that of the second embodiment. The difference is that the predistortion circuit 150 is provided for a saturation amplifier 3' having a lag characteristic instead the phase leading, that is, the predistortion circuit 150 compensates the amplifying characteristic and the phase lag characteristic.

In the predistortion circuit 50 in the second embodiment, the drain-source stray capacitance Cds is used for phase compensation. Actually, the drain-source stray capacitance Cds also exists in the FET 52 and thus, it is connected in parallel to the phase compensation inductor Lp.

In this predistortion circuit 150, the current ILp flowing through the phase compensation inductor Lp lags from the current Irds flowing through the differential resistance Rds by 90°. Thus, the phase of the current Is flowing through the internal resistance Rs of the signal source 2 lags. Accordingly, the phase of the output voltage Vout advances from the input signal voltage Vin from the signal source 2 (this corresponds to the phase of the current Icds shifted by 180° in FIG. 9). This compensates the lagged phase in the saturation amplifier 3' in addition to the amplifying compensation. The operation of the amplification compensation is the same as the second embodiment, so that the detailed explanation is omitted.

In the predistortion circuits 1, 50, 100, and 150, as the FETs, N channel MOSFETs or HEMTs can be used. The HEMT provides a low noise characteristic but as shown in FIG. 3, at the region where the drain-source voltage Vds is large, the drain current Ids is inconstant and the differential resistance Rds does not varies up to infinite. On the other hand, in the above-mentioned embodiments, the phase-inverted input signal is supplied to the gate electrode, so that the differential resistance of the HEMT can be made sufficiently large at the region where the drain-sauce voltage Vds is large. This performs great gain compression and phase compensation at the saturation region of the saturation amplifier 3 though the HEMT is used.

Moreover, instead the N channel MOSFET and the HEMT, insulation gate type of FETs such as a P channel MOSFET or a MIS (metal Insulator Semiconductor) or a junction type of FET such as a MES (Metal Semiconductor), a SIT (Static induction Transistor), or the like can be used.

Further, instead the FETs, a bipolar transistor or an HBT (heterojunction Bipolar Transistors) can be used.

As mentioned above, in the compensating the amplifying the non-linearity of the active element and the phase compensation by interaction between the active element and the phase compensation capacitance or the phase compensation inductor connected in parallel to the active element, the phase-inverted input signal is applied to the control electrode of the active element. The variation direction of the differential resistance in the active element in response to the variation of the phase-inverted input signal is the same as that in response to the input signal applied to the output electrode of the active element. Thus, the variation of the differential resistance can be made large. This provides a larger gain compression compensation and a larger phase compensation at the saturation region of the saturation amplifier though the active element shows inconstant drain current at the region where the drain-source voltage is large.

Moreover, variation of the gain of the phase inverting circuit adjusts the compensation amount of distortion. Further, the phase inverting circuit can be provided with passive elements, so that the circuit structure is simplified.

As mentioned above, the input signal is phase-inverted to supply the inverted signal to the gate of the FET. When the gate-source voltage Vgs decreases, the differential resistance Rds of the FET increases. Moreover, the differential resistance Rds also increases when the drain-source voltage Vds increases. That is, if the magnitude of the input signal from the signal source 2 increases, the gate-source voltage Vgs decreases and the drain-source voltage Vds increases, so that the differential resistance Rds varies largely. This compensates the non-linearity of the following saturation amplifier. Phase compensation is also effected with a capacitor (stray capacitor) or an inductor connected in parallel to the FET in corporation of the phase inverter. The phase inverter may be structured using the stray capacitances of the FET.

In the circuit using an FET, the drain electrode and the source electrode are exchangeably used. Thus, the drain electrode may be referred as a first electrode and the source electrode may be referred as a second electrode. Inversely, the drain electrode may be referred as a second electrode and the source electrode may be referred as a first electrode. Moreover, the gate electrode may be referred as a control gate.

What is claimed is:

1. A predistortion circuit for compensating a non-linear characteristic of a following amplifier comprising:

a line coupled between an input terminal and an output terminal for receiving an input signal;

an active element connected between said line and ground;

bias voltage supplying means for supplying a predetermined bias voltage to a control electrode of said active element;

phase compensation means connected in parallel to said active element; and inverting means coupled to said control electrode for inverting a phase of said input signal and supplying the inverted input signal to said control electrode of said active element.

2. A predistortion circuit as claimed in claim 1, wherein said phase compensation means comprises a capacitance.

3. A predistortion circuit as claimed in claim 1, wherein said active element comprises a stray capacitance between a first electrode of said active element connected to said line and a second electrode of said active element connected to the ground, and said phase compensation means compensates a phase of said input signal with said stray capacitance.

4. A predistortion circuit as claimed in claim 1, wherein said phase compensation means comprises an inductor.

5. A predistortion circuit as claimed in claim 3, wherein said phase compensation means further comprises an inductor.

6. A predistortion circuit as claimed in claim 1, wherein said inverting means further comprises gain controlling means for controlling a gain of said inverting means to control an amount of compensating the non-linear characteristic.

7. A predistortion circuit as claimed in claim 3, wherein said inverting means further comprises gain controlling means for controlling a gain of said inverting means to control an amount of compensating the non-linear characteristic.

8. A predistortion circuit as claimed in claim 1, wherein said active element comprises a stray capacitance between a first electrode of said active element connected to said line and said control gate of said active element, and said inverting means comprises a capacitor connected between said control gate and the ground, and an inductor connected in equivalently parallel to said capacitor to invert said phase of said input signal with said stray capacitance, said capacitor, and said inductor.

* * * * *